(12) United States Patent
Huang et al.

(10) Patent No.: US 8,546,062 B2
(45) Date of Patent: Oct. 1, 2013

(54) SELF-FORMING TOP ANTI-REFLECTIVE COATING COMPOSITIONS AND, PHOTORESIST MIXTURES AND METHOD OF IMAGING USING SAME

(75) Inventors: Wu-Song Huang, Brewster, NY (US); Irene Popova, Beacon, NY (US); Pushkara Rao Varanasi, Poughkeepsie, NY (US); Libor Vyklicky, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/301,841

(22) Filed: Nov. 22, 2011

(65) Prior Publication Data
US 2012/0070782 A1      Mar. 22, 2012

Related U.S. Application Data

(62) Division of application No. 12/409,738, filed on Mar. 24, 2009, now Pat. No. 8,097,401.

(51) Int. Cl.
*C07C 409/22* (2006.01)
*G03F 7/039* (2006.01)
*G03F 7/004* (2006.01)

(52) U.S. Cl.
USPC ................. 430/270.1; 526/245; 430/273.1

(58) Field of Classification Search
None
See application file for complete search history.

(56) References Cited

U.S. PATENT DOCUMENTS

| | | | |
|---|---|---|---|
| 5,157,091 A | 10/1992 | Masataka et al. | |
| 6,972,201 B1 | 12/2005 | Subramanian et al. | |
| 7,241,707 B2 | 7/2007 | Meagley et al. | |
| 7,598,016 B2 | 10/2009 | Kobayashi et al. | |
| 2003/0228537 A1 | 12/2003 | Yoon et al. | |
| 2007/0087285 A1 | 4/2007 | Huang et al. | |
| 2007/0117041 A1 | 5/2007 | Noelscher et al. | |
| 2008/0020290 A1* | 1/2008 | Hatakeyama et al. | 430/4 |
| 2008/0026315 A1* | 1/2008 | Huang et al. | 430/270.1 |
| 2008/0193879 A1 | 8/2008 | Allen et al. | |
| 2008/0194764 A1* | 8/2008 | Komoriya et al. | 525/200 |
| 2008/0213707 A1 | 9/2008 | Brodsky et al. | |
| 2008/0241736 A1 | 10/2008 | Kobayashi et al. | |
| 2010/0112475 A1* | 5/2010 | Natsume et al. | 430/270.1 |

FOREIGN PATENT DOCUMENTS

| | | |
|---|---|---|
| EP | 1754999 A2 | 2/2007 |
| JP | 2003-140345 A * | 5/2003 |
| JP | 2008-239646 A * | 10/2008 |
| WO | WO2007057263 | 5/2007 |
| WO | WO2008049844 | 5/2008 |
| WO | WO-2008/126625 A1 * | 10/2008 |

OTHER PUBLICATIONS

English translation of JP, 2003-140345, A (2003) from machine translation from AIPN Japan Patent Office National Center for Industrial Property Information and Training, generated Sep. 3, 2012, pp. 1-65 and 1-8.*

(Continued)

*Primary Examiner* — Cynthia Hamilton
(74) *Attorney, Agent, or Firm* — Schmeiser, Olsen & Watts; Joseph P. Abate

(57) ABSTRACT

A composition of matter. The composition of matter includes a polymer having an ethylenic backbone and comprising a first monomer having an aromatic moiety, a second monomer having a base soluble moiety or an acid labile protected base soluble moiety, and a third monomer having a fluoroalkyl moiety. Also a photoresist formulation including the composition of matter and a method of imaging using the photoresist formulation including the composition of matter.

16 Claims, 3 Drawing Sheets

(56) References Cited

OTHER PUBLICATIONS

English translation of JP, 2008-239646, A (2008) from machine translation from AIPN Japan Patent Office National Center for Industrial Property Information and Training, generated Feb. 19, 2013, 24 pages.*
International Application No. PCT/US10/28430, Filing Date: Mar. 24, 2010, ISR and Written Opinion.
Office Action—Ex Parte Quayle (mail date Jul. 15, 2011) for U.S. Appl. No. 12/409,738, filed Mar. 24, 2009, First Named Inventor Wu-Song Huang et al., Confirmation No. 1953.
Notice of Allowance (mail date Sep. 12, 2011) for U.S. Appl. No. 12/409,738, filed Mar. 24, 2009, First Named Inventor Wu-Song Huang et al., Confirmation No. 1953.
Lorenz, H, et al—"High-aspect ratio, ultrathick, negative-tone near-UV photoresist and its applications for MEMS"—Sensors and Actuators A—vol. 64—(1998) 33-39.
Zhai, Xiao-Xiao, et al.—"Research Development on Water Soluble Photoresist", Photographic Science and Photochemistry—vol. 25, No. 1.
Application No. 201080013928.3 Filing Date: Mar. 24, 2010 Information Materials for IDS from SIPO Office Action Dated Apr. 25, 2013.

* cited by examiner

SELF-FORMING TOP ANTI-REFLECTIVE COATING COMPOSITIONS AND, PHOTORESIST MIXTURES AND METHOD OF IMAGING USING SAME

RELATED CASES

This Application is a division of patent application Ser. No. 12/409,738 filed on Mar. 24, 2009, now U.S. Pat. No. 8,097,401, issued Jan. 17, 2012.

FIELD OF THE INVENTION

The present invention relates to the fields of chemistry, photolithography and microelectronic fabrication; more specifically, the embodiments of the invention are directed to photoresist additives, photoresist formulations mixed with the photoresist additives and methods of forming photolithographic images using of photoresist formulations containing the photoresist additives.

BACKGROUND OF THE INVENTION

In the microelectronics industry there is a continuing need to reduce the size of microelectronic devices, which is largely determined by the photolithographic imaging process used. For many photolithographic imaging processes the minimum image size printable is limited by effects associated with refractive index and undesirable reflections of the imaging radiation. To this end many photolithographic imaging processes employ antireflective coatings. However, conventional antireflective coatings require additional equipment and time, thereby adding to microelectronic fabrication costs. Accordingly, there exists a need in the art to mitigate the deficiencies and limitations described hereinabove.

SUMMARY OF THE INVENTION

A first aspect of the present invention is a composition of matter, comprising: a polymer having an ethylenic backbone and comprising a first monomer having an aromatic moiety, a second monomer having a base soluble moiety or an acid labile protected base soluble moiety, and a third monomer having a fluoroalkyl moiety; and a casting solvent.

A second aspect of the present invention is a photoresist formulation, comprising: a photoresist polymer; at least one photoacid generator; a casting solvent; and a polymer having an ethylenic backbone and comprising a first monomer having an aromatic moiety, a second monomer having a base soluble moiety or an acid labile protected base soluble moiety, and a third monomer having a fluoroalkyl moiety, wherein the polymer has a refractive index of less than about 1.53 with respect to a radiation wavelength of about 193 nm.

A third aspect of the present invention is a method of forming a patterned material feature, comprising: (a) applying a photoresist formulation over a material on a substrate, the photoresist formulation comprising: a photoresist polymer; at least one photoacid generator; a casting solvent; and a polymer having an ethylenic backbone and comprising a first monomer having an aromatic moiety, a second monomer having a base soluble moiety or an acid labile protected base soluble moiety, and a third monomer having a fluoroalkyl moiety, wherein the polymer has a refractive index of less than about 1.53 with respect to a radiation wavelength of about 193 nm; after (a), (b) the photoresist formulation separating to form a top anti-reflective coating and a photoresist layer, the photoresist layer between the anti-reflective coating and the substrate; after (b), (c) patternwise exposing the photoresist layer to actinic radiation thereby creating a pattern of radiation-exposed regions in the photoresist layer; after (c), (d) selectively removing the antireflective coating and the radiation-exposed regions in the photoresist layer to form openings through the photoresist layer; and after (d), (e) etching or ion implanting through the openings to form the patterned material features.

These and other aspects of the invention are described in further detail below.

DETAILED DESCRIPTION OF THE INVENTION

Figure 1:
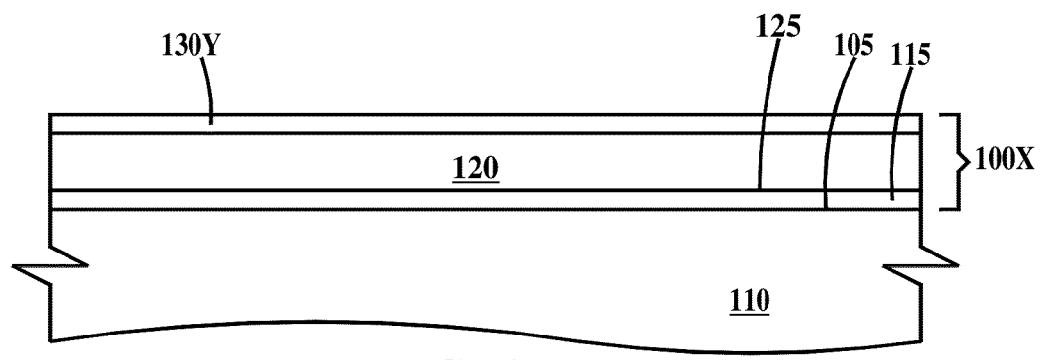
FIG. 1 is a cross section illustrating a photolithographic imaging layer according to embodiments of the present invention.

The term "acid-labile" refers to a molecular segment containing at least one covalent bond that is cleaved upon exposure to acid. In one example, the reaction of acid-cleavable groups herein with photo-generated acid occurs only, or is promoted greatly by, the application of heat. Those skilled in the art will recognize the various factors that influence the rate and ultimate degree of cleavage of acid-cleavable groups as well as the issues surrounding integration of the cleavage step into a viable manufacturing process. The product of the cleavage reaction is generally an acidic group, which, when present in sufficient quantities, imparts solubility to the polymers of the invention in basic aqueous solutions.

Mole % is the number of moles of each repeat unit in one mole of polymer. One mole of polymer is 100% mole percent. For example if a mole of a first repeat unit weighs 10 grams, a mole of a second repeat unit weighs 20 grams and a mole of a third repeat unit weighs 20 grams, a mole of polymer comprising about 33% mole percent of each of the three repeat unit would weigh about 50 grams. If a polymer was synthesized using 20 grams of each of the three repeat units, the mole % of the first repeat unit would be about 50%, the mole % of the second repeat unit would be about 25%, and the mole % of the third repeat unit would be about 25%.

The embodiments of the present invention encompass polymer additives, polymer additive formulations, and photoresist formulations containing the polymer additives which will migrate to the surface and may segregate into two layers after application to a substrate, an upper layer acting as a top antireflective coating (TARC) and a lower photoresist layer. The photoresist and polymer additives are particularly suited for use in dry or wet 193 nm lithographic processes. The polymer additives are characterized by a refractive index n of about 1.53 or less with respect to about 193 nm wavelength radiation and the presence of a polymer that contains aromatic or cyclic moieties and that is soluble in aqueous alkaline developers typically used for developing images in photoresist layers. The polymer additives are further characterized by being not photoactive to radiation having a wavelength of about 193 nm. The polymer additives are further characterized by being not containing silicon (Si) atoms.

The polymer additives of the embodiments of the present invention preferably have an ethylenic backbone and contain a first monomer having an aromatic moiety, a second monomer having either a base soluble moiety or an acid labile protected base soluble moiety, and a third monomer having one or more fluoroalkyl moieties. The backbone of the polymer is preferably free of unsaturated carbon bonds. The second monomer may additionally contain one or more fluoroalkyl moieties.

The aromatic moieties of the first monomer are preferably selected from the group consisting of substituted or un-substituted aromatic moieties. More preferably, aromatic moieties are selected from the group consisting of substituted fused aromatic moieties, substituted heterocyclic aromatic moieties, un-substituted fused aromatic moieties and un-substituted heterocyclic aromatic moieties. In the substituted form, the aromatic moieties may contain attached cyclic structures. Some preferred aromatic moieties are naphthalene and thiophene. Examples for substituted naphthalene containing cyclic structures are acenaphthene (i.e., acenaphthyl group) and hexahydropyrene (i.e., hexahydropyrenyl group). The aromatic moieties are preferably present as pendant groups. The amount of aromatic moieties in the polymer additives are preferably sufficient to reduce the refractive index n to less than about 1.53, more preferably to less than about 1.42, and most preferably to an n value between about 1.3 and about 1.53. While the self-form TARC is typically very thin, it is still preferable to avoid excessive amounts of aromatic groups, which may cause too much absorption at about 193 nm. The polymer additives of the invention preferably have an extinction coefficient k of about 0.05 to 0.25 with respect to a radiation wavelength of about 193 nm. The polymers additives preferably contain between about 5 mole % to about 80 mole % of monomeric units having aromatic moieties, more preferably between about 20-70 mole %, most preferably between about 25-65 mole %.

A specific example of a first monomer containing an aromatic group is:

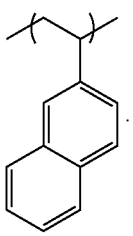
VN

The base soluble moieties or acid labile protected base soluble moieties of the second monomer preferably include moieties selected from the group consisting of hydroxyl groups, sulfonamidyl groups, N-hydroxy dicarboxyimidyl groups, other dicarboxyimidyl groups, other amino groups and other imidyl groups. The amount of solubility-promoting functionality needed may depend on the degree of hydrophobicity of the aromatic component and the amount of aromatic component used. In one example, the solubility-promoting functionality may be provided in the form of acrylate or methacrylate monomers having a carboxylic acid moiety. The base soluble moieties or acid labile protected base soluble moieties of the second monomer may include fluorine atoms. The polymers of the TARC additive preferably contain between about 5 mole % to about 80 mole % of monomeric units having base soluble moiety or acid labile protected base soluble moieties, more preferably between about 20-70 mole %, most preferably between about 25-65 mole %.

Specific examples of second monomers containing base soluble moieties are:

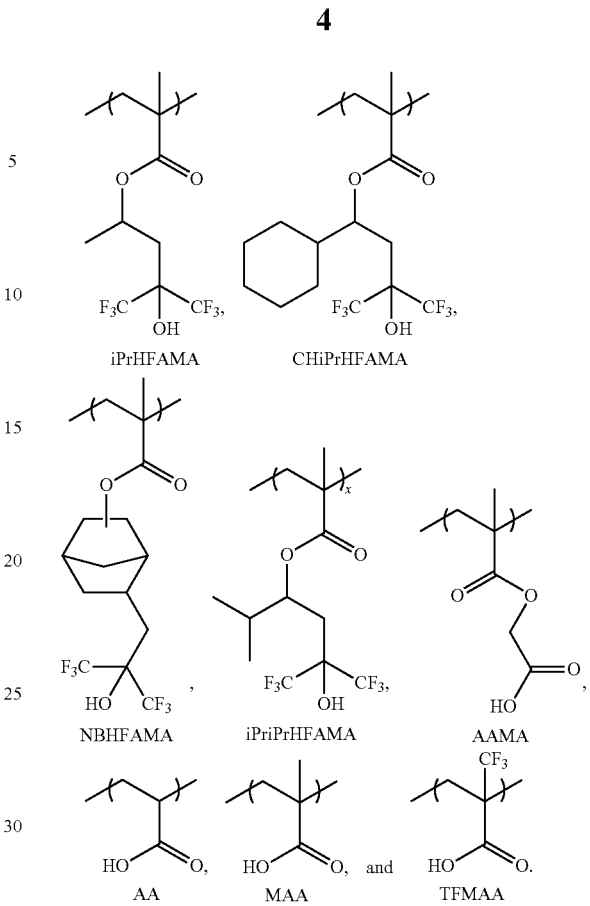

Specific examples of second monomers containing acid labile protected base soluble moieties are:

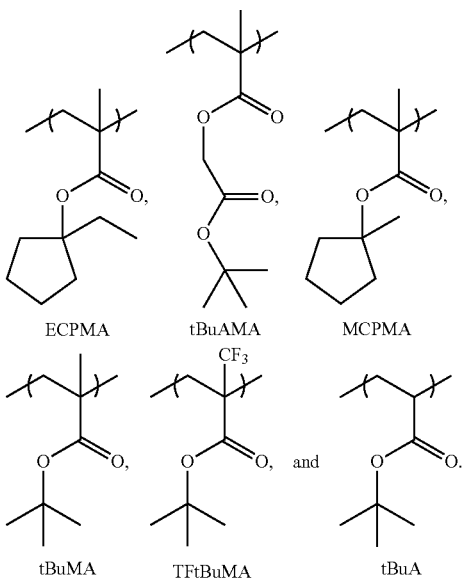

The fluoroalkyl moieties of the third monomer preferably include trifluoromethyl groups. The amount of fluorine-containing monomeric unit is preferably about 10 mole % to about 90 mole %, more preferably about 20 mole % to about 80 mole %, most preferably about 30 mole % to about 70 mole %.

Specific examples of third monomers containing fluoroalkyl moieties are:

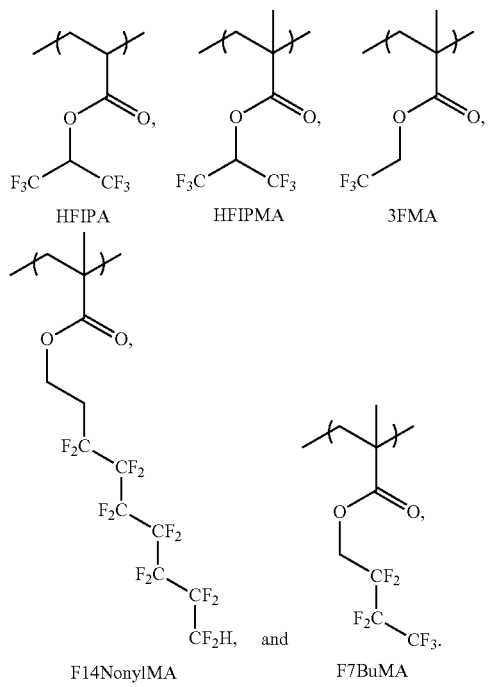

F14NonylMA    F7BuMA

In one example, polymers according to the embodiments of the present invention consist essentially of terpolymers having one monomer selected from each of the three first, second and third monomers described supra. In one example, polymers according to the embodiments of the present invention consist essentially of polymers having one monomer selected from each of the three first, second and third monomers and one or more additional and different monomers selected from at least one of the three first, second and third monomers. In one example, polymers according to the embodiments of the present invention comprise one monomer selected from each of three first, second and third monomers and one or more additional monomers.

In first, second and third examples of a polymer additive according to embodiments of the present invention, is a terpolymer consisting essentially of:

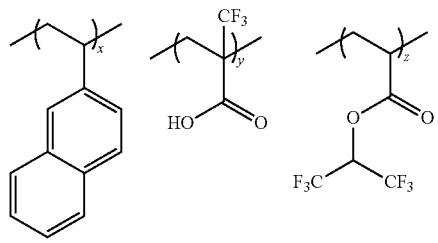

wherein x:y:z=5 to 80 mole %:5 to 80 mole %:=10 to 90 mole % and x+y+z does not exceed 100 mole % as exemplified by:
Polymer 1: x=30 mole %, y=30 mole % and z=40 mole %;
Polymer 2: x=30 mole %, y=40 mole % and z=30 mole %; and
Polymer 3: x=30 mole %, y=50 mole % and z=20 mole %.

Monomers (y) of polymers 1, 2 and 3 include both a base soluble moiety and a fluoroalkyl moiety.

In a fourth example of a polymer additive according to embodiments of the present invention, is a terpolymer consisting essentially of:

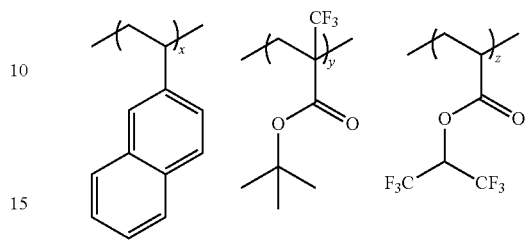

wherein x:y:z=5 to 80 mole %:5 to 80 mole %:=10 to 90 mole % and x+y+z does not exceed 100 mole % as exemplified by:
Polymer 4: x=30 mole %, y=30 mole % and z=40 mole %.
Monomer (y) of the fourth polymer includes both an acid labile protected base soluble moiety and a fluoroalkyl moiety.

In a fifth example of a polymer additive according to embodiments of the present invention, is a terpolymer consisting essentially of:

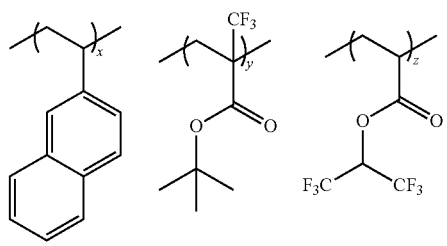

wherein x:y:z=5 to 80 mole %:5 to 80 mole %:=10 to 90 mole % and x+y+z does not exceed 100 mole % as exemplified by:
Polymer 5: x=30 mole %, y=40 mole % and z=30 mole %.
Monomer (y) of the polymer 5 includes an acid labile protected base soluble moiety, which contains no fluorine atoms.

The polymer additives of the invention preferably have a weight average molecular weight of at least about 1000, more preferably a weight average molecular weight of about 1500 to about 50000 and still more preferably a weight average molecular weight of about 3000 to about 10000. The polymer additives of the invention may be made by conventional polymerization techniques using commercially available and/or easily synthesized monomers. If desired, mixtures of different polymer additives of the invention may be used or the polymer additives may contain other polymer components. In general, however, the polymer additives of the invention preferably consist essentially of the polymers of the invention. It should be understood that in the examples supra, the "x" and "y" and "z" monomers are interspersed in no particular order in the backbone of the polymer.

Polymer additive formulations include polymer additive polymers according to embodiments of the present invention dissolved in a casting solvent. In one example the polymer additive formulation contains between about 5% by weight and about 30% by weight of polymer additive(s). In one example the casting solvent is propylene glycol monomethyl ether acetate (PGMEA). Suitable casting solvents for polymer additive formulations include, but are not limited to PGMEA, ethers, glycol ethers, aromatic hydrocarbons, ketones, esters, propylene glycol monomethyl ether acetate, ethyl lactate, γ-butyrolactone, cyclohexanone and combinations thereof.

Self-forming TARC photoresist formulations are mixtures of the polymer additives according to embodiments of the present invention and a photoresist formulation with the mixture preferably containing between about 3% by weight and about 30% by weight of polymer additive(s), more preferably between about 5% by weight and about 25% by weight of polymer additive(s) and still more preferably between about 7% by weight and about 20% by weight of polymer additive(s) and a casting solvent (e.g., PGMEA). In one example, the photoresist formulation of the self-forming TARC photoresist formulations is a positive photoresist formulation. Positive photoresist formulations include at least one polymer, at least one photo acid generator (PAG) and one or more casting solvents (e.g., PGMEA), the polymer being insoluble in aqueous basic solution until reaction with acid generated by the PAG when the PAG is exposed to actinic radiation. Suitable casting solvents for self-forming TARC photoresist formulations include, but are not limited to PGMEA, ethers, glycol ethers, aromatic hydrocarbons, ketones, esters, propylene glycol monomethyl ether acetate, ethyl lactate, γ-butyrolactone, cyclohexanone and combinations thereof.

Figure 2A:
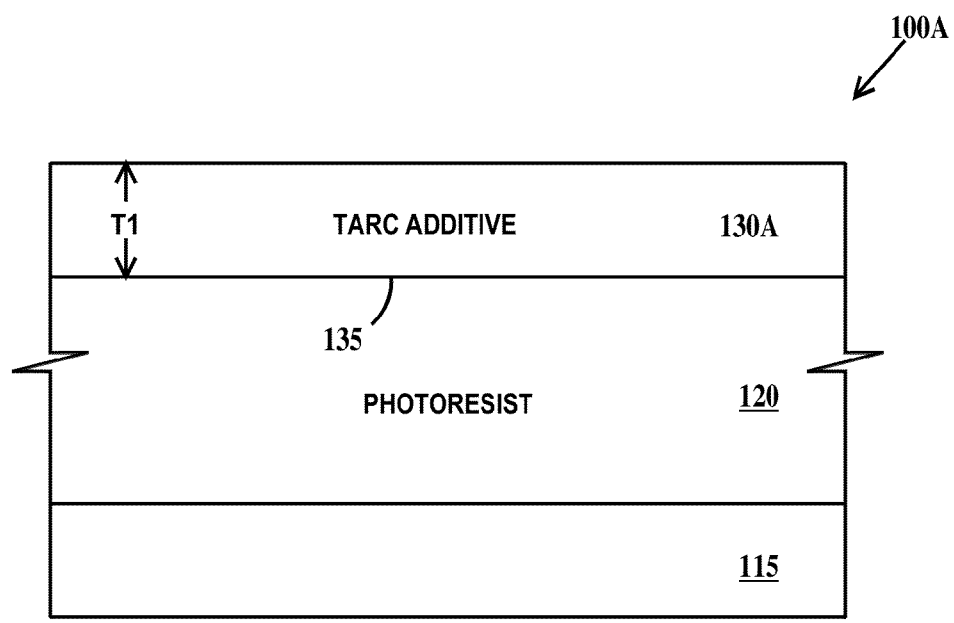
FIGS. 2A through 2C are enlarged cross-sections of FIG. 1.
Figure 2B:
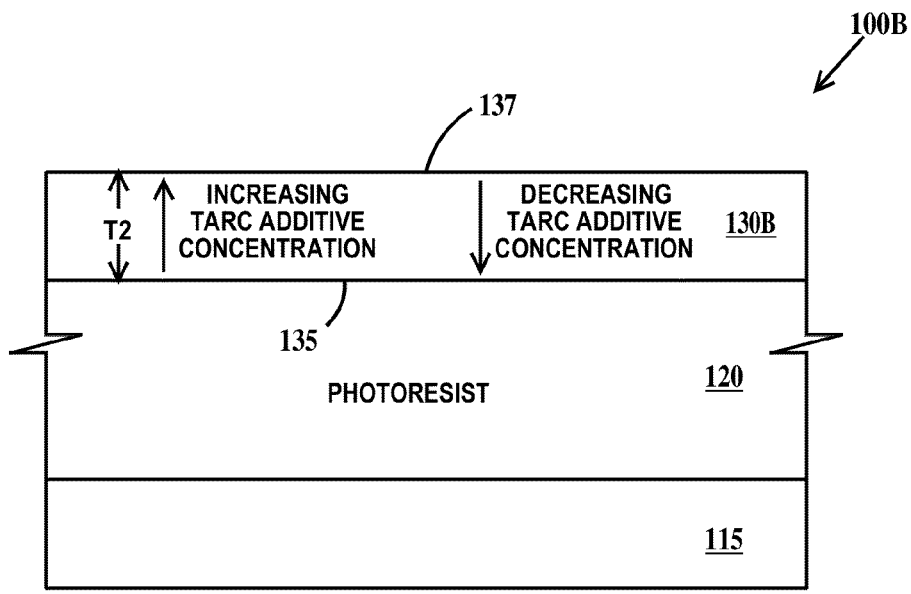
Figure 2C:
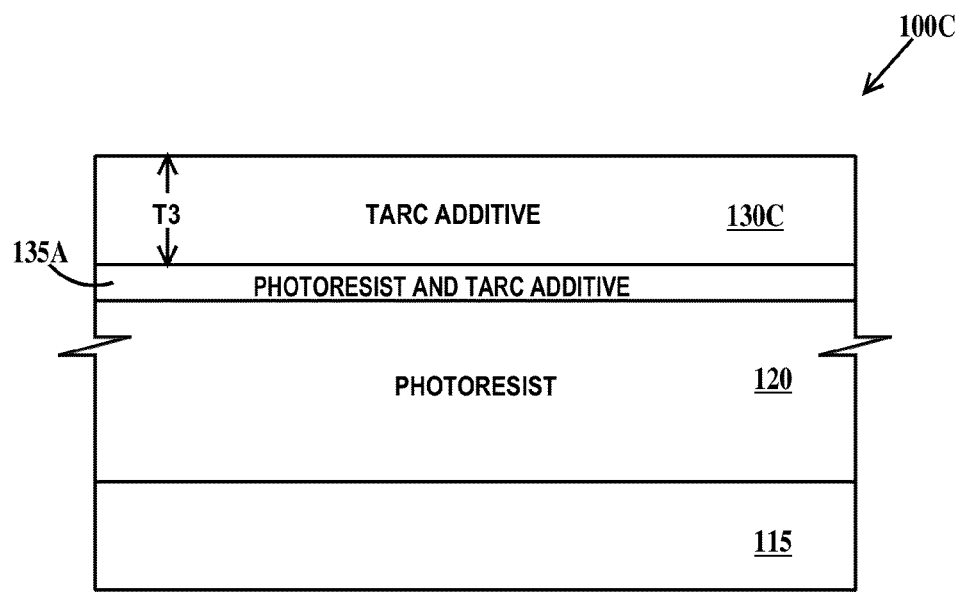

FIG. 1 is a cross section illustrating a photolithographic imaging layer according to embodiments of the present invention. In FIG. 1, an imaging layer 100X (where X represents A, B or C) is formed on a top surface 105 of a material 110 on a substrate (not shown). Imaging layer 100X comprises an optional BARC layer 115 on top surface 105 of material 110, a photoresist layer 120 on a top surface 125 of BARC 115 (if present, otherwise on top surface 105 of material 110) and a TARC 130Y (where Y represents A, B, or C) on photoresist layer 120. BARC 115 is formed by spin application of a BARC formulation (e.g., a BARC polymer in a casting solvent). Photoresist layer 120 and TARC 130Y are formed (after BARC 115 is formed) by spin applying a photoresist formulation containing one or more polymer additives of the present invention. An optional post apply bake (greater than about 25° C.) to drive out the photoresist casting solvent may be performed. TARC 130Y has self-formed by the polymer additive(s) separating from the photoresist during and/or after the spin application process. There are several distributions of materials possible in photoresist layer 120 and TARC 130Y illustrated in FIGS. 2A through 2C and described infra. FIGS. 2A through 2C are enlarged cross-sections of FIG. 1.

In a first example, in FIG. 2A, a TARC 130A and photoresist layer 120 are separated by a sharp interface 135. There is essentially no polymer additive in photoresist layer 120 and essentially no photoresist polymer in TARC 130A. TARC 130A has a thickness of T1. In one example T1 is about $\frac{1}{4}n_{TARC}$ of the wavelength of the actinic radiation that will be used to expose photoresist layer 120, when TARC has low absorption, wherein $n_{TARC}$ is the real part of refractive index of TARC. For absorbing TARC, T1 is less than $\frac{1}{4}n_{TARC}$ of the wavelength of the actinic radiation that will be used to expose photoresist layer 120. In one example T1 is no greater than about 45 nm and preferably no greater than about 30 nm. The value of T1 is controlled by the amount of polymer additive added to the photoresist formulation. In one example, the refractive index of the polymer additive is less than about 1.53 at about 193 nm.

In a second example, in FIG. 2B, a TARC 130B and photoresist layer 120 are separated by sharp interface 135. There is essentially no polymer additive in photoresist layer 120; however, there is photoresist polymer in TARC 130B. The polymer additive concentration in TARC 130B increases and the photoresist polymer concentration decreases from interface 135 to a top surface 137 of TARC 130B. The polymer additive concentration in TARC 130B decreases and the photoresist polymer concentration increases from interface top surface 137 of TARC 130B to interface 135. TARC 130B has a thickness of T2. In one example T2 is no greater than about 45 nm and preferably no greater than about 30 nm. The value of T2 is controlled by the amount of polymer additive added to the photoresist formulation. In one example, the refractive index of the polymer additive is less than about 1.53 at about 193 nm.

In a third example, in FIG. 2C, a TARC 130C and photoresist layer 120 are separated by graded interface layer 135A. There is essentially no polymer additive in photoresist layer 120, and no photoresist polymer in TARC 130C, however interface layer 135A includes both photoresist polymer and polymer additive. TARC 130C has a thickness of T3. In one example T3 is no greater than about 45 nm and preferably no greater than about 30 nm. The value of T3 is controlled by the amount of polymer additive added to the photoresist formulation. In one example, the refractive index of the polymer additive is less than about 1.53 at about 193 nm.

In additional examples, photoresist layer 120 of FIGS. 2A, 2B and 2C may include less than about 30% by weight of polymer additive. In additional examples, photoresist layer TARC 130A, 130B and 130 of respective FIGS. 2A, 2B and 2C may include less than about 50% by weight of photoresist components. In an additional example there is only a single graded polymer additive/photoresist layer formed with the polymer additive concentration increasing and the concentration of photoresist components decreasing from the top surface of the BARC to the top surface of the polymer additive/photoresist layer and the polymer additive concentration decreasing and the concentration of photoresist components increasing from the top surface of the polymer additive/photoresist layer toward the top surface of the BARC.

Figure 3:
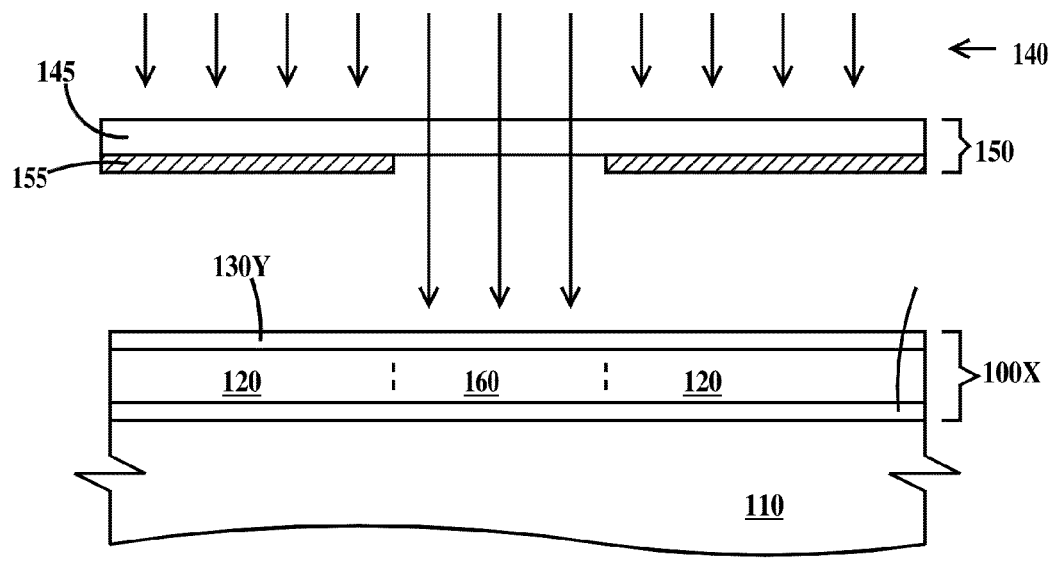
FIGS. 3 through 5 are cross-sections illustrating imaging according to embodiments of the present invention.
Figure 4:
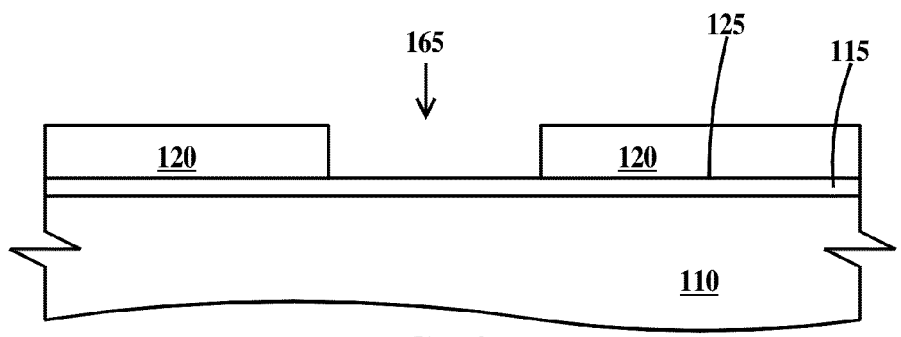
Figure 5:
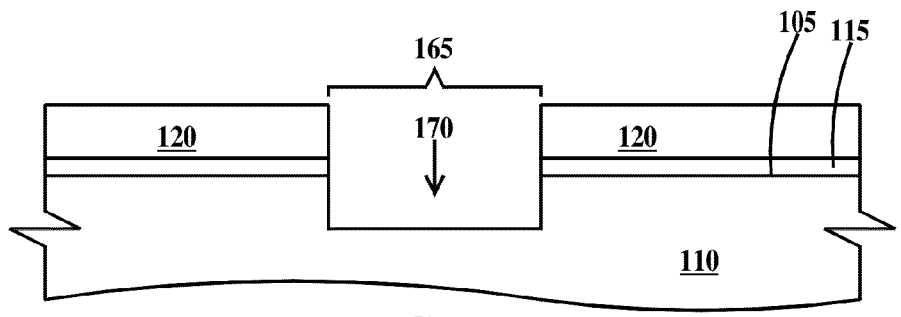

FIGS. 3 through 5 are cross-sections illustrating imaging according to embodiments of the present invention. In FIG. 3, imaging layer 100X is patternwise exposed by passing actinic radiation 140 (e.g., light with a wavelength of about 193 nm) through a clear region 145 of a photomask 150, but blocked by opaque regions 155 of the photomask. The exposure may be made in a conventional photolithographic tool or in an immersion lithography tool. In a conventional photolithographic tool the exposed surface of TARC 130Y is in contact with air or another gas. In an immersion lithography tool the exposed surface of TARC 130Y is in contact with water or another liquid. In conventional photolithography it is desirable for the index of refraction of TARC 130Y to be as close as possible to 1. In immersion photolithography it is desirable for the index of refraction of TARC 130Y to be as close as possible to 1.44 (with water as the immersion liquid). In immersion photolithography TARC 130Y should not be soluble in the immersion fluid. Actinic radiation striking imaging layer 100X forms a latent image (i.e., radiation-exposed region) in photoresist 160. In one example, the actinic radiation causes a PAG to generate acid, which renders the photoresist polymer soluble in a developer solution comprising an aqueous basic solution (e.g., aqueous tetramethyl ammonium hydroxide (TMAH)). In one example, the actinic radiation causes a PAG to become sensitive to heat and a post exposure bake cause the PAG to generate acid, which renders the photoresist polymer soluble in the aqueous basic solution.

In FIG. 4, after developing, an opening 165 is formed in photoresist layer 120. Note that TARC 130Y (see FIG. 3) has been removed by the developer, but BARC 115 has not been removed by the developer. At this point an exemplary ion implant process may be performed to form a patterned feature in material 110 and thereafter, remaining photoresist 120 and BARC 115 are removed, terminating processing.

Alternatively, after developing as described supra and illustrated in FIG. 4, in FIG. 5, an exemplary etch process (e.g., a reactive ion etch) has been performed to form a trench 170 (i.e., a patterned feature) in material 110. The etch has removed BARC 115 where BARC 155 was not protected by photoresist 120. It is advantageous that BARC 115 not be removed so as to control the dimensions of trench 170. Thereafter, remaining photoresist 120 and BARC 115 are removed.

The invention is further described by the examples infra. The invention is not limited to the specific details of the examples. The numbers in parenthesis (e.g. 40/30/40 in each example, indicate the mole % of each of the indicated monomers in the polymer in the order x, y and z. It should be understood that no particular sequence of monomers within a given polymer molecule is intended and that the sequence of monomers in any given polymer molecules may vary as well the exact number of monomers of each type. Thus the mole % given are averages of all polymer molecules in a sample.

EXAMPLE 1

Synthesis of polymer of 2-vinylnaphthalene, 2-(trifluoromethyl)acrylic acid and 1,1,1,3,3,3-hexafluoroisopropyl acrylate (VN/TFMAA/HFIPA (30/30/40))

To a round bottom flask equipped with condenser, thermometer, an argon inlet and a magnetic stirrer bar, the following were added: 2-vinylnaphthalene (VN) monomer (1.388 g, 0.009 mole), 2-(trifluoromethyl)acrylic acid monomer (TFMAA) (1.261 g, 0.009 moles), 1,1,1,3,3,3-hexafluoroisopropyl acrylate (HFIPA) (2.665 g, 0.012 moles), 2,2'-azobisisobutyronitrile (AIBN) initiator (0.295 g, 6% of total moles of monomers), and ~18 g of tetrahydrofuran (THF). The reaction mixture was stirred at room temperature and bubbled with argon (Ar) flow for 45 minutes prior to turning the heating mantle on. The reaction was carried out overnight at 72° C. under Ar inert atmosphere. Then the reaction solution was cooled to room temperature and precipitated in deionized (DI) water. The polymer was re-dissolved in acetone and re-precipitated in DI water. The solid was collected and dried in vacuum oven at 60° C. overnight. The molecular weight (Mw) was determined by gel permeation chromatography (GPC) to be 8.2K. The polymer synthesized was dissolved in PGMEA to obtain 3 wt. % of solid in solution. The polymer solution was spin-coated on a silicon wafer baked on a hot plate at 90° C. for 60 seconds, then n and k values were measured with VB-250 VASE Ellipsometer manufactured by J.A. Woollam Co. Inc. The measured optical properties of the film for about 193 nm radiation exhibited a refractive index (n) of 1.322 and an extinction coefficient (k) of 0.134.

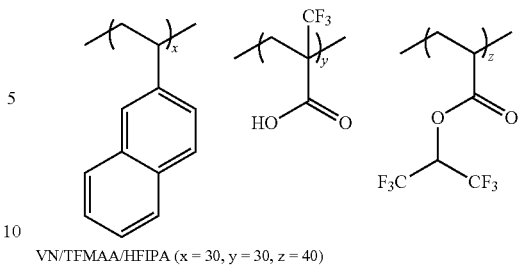

VN/TFMAA/HFIPA (x = 30, y = 30, z = 40)

EXAMPLES 2 AND 3

Synthesis of polymers of 2-vinylnaphthalene, 2-(trifluoromethyl)acrylic acid and 1,1,1,3,3,3-hexafluoroisopropyl acrylate with different monomer mole ratios (VN/TFMAA/HFIPA (30/40/30)) and (VN/TFMAA/HFIPA (30/50/20))

The polymers of Examples 2 and 3 use the same monomers as Example 1, but using different monomer proportions and were synthesized with the same procedure as described in Example 1. The amounts of the monomers used in the reaction are shown in the table below:

| Polymer | VN | TFMAA | HFIPMA | Mw |
|---|---|---|---|---|
| VN/TFMAA/HFIPA (30/40/30) | 1.388 g (0.009 mole) | 1.681 g (0.012 mole) | 1.999 g (0.009 mole) | 6.2K |
| VN/TFMAA/HFIPA (30/50/20) | 1.388 g (0.009 mole) | 2.109 g (0.015 mole) | 1.333 g (0.006 mole) | 3.6K |

The polymers synthesized were dissolved in PGMEA to obtain 8.5 wt. % of solid in solution. The polymer solutions were spin-coated on silicon wafers baked on a hot plate at 100° C. for 60 seconds. The measured optical properties of the films at about 193 nm radiation are shown in the following table.

| Sample | Polymer Composition | n at 193 nm | k at 193 nm |
|---|---|---|---|
| 1 | VN/TFMAA/HFIPA (30/40/30) | 1.342 | 0.137 |
| 2 | VN/TFMAA/HFIPA (30/50/20) | 1.399 | 0.114 |

EXAMPLE 4

Synthesis of polymer of 2-vinylnaphthalene, t-butyl-2-(trifluoromethyl) acrylate and 1,1,1,3,3,3-hexafluoroisopropyl acrylate (VN/TFtBuMA/HFIPA (30/40/30))

To a round bottom flask equipped with condenser, thermometer, an argon inlet and a magnetic stirrer bar, the following were added VN monomer (1.39 g, 0.009 mole), t-butyl-2-(trifluoromethyl) acrylate monomer (TFtBuMA) (2.35 g, 0.012 moles), HFIPA (2.0 g, 0.009 moles), AIBN (0.344 g, 7% of total moles of monomers), and ~20 g of THF. The reaction mixture was stirred at room temperature and bubbled with Ar flow for 45 minutes prior to turning the heating mantle on. The reaction was carried out overnight at 72° C. under Ar inert atmosphere. Then the reaction solution was cooled to room temperature and precipitated in DI water. The polymer was re-dissolved in acetone and re-precipitated in DI water. The solid was collected and dried in vacuum oven at 60° C. overnight. The molecular weight (Mw) was determined by GPC to be 3.7K. The polymers synthesized was dissolved in PGMEA to obtain 8.5 wt. % of solid in solution. The polymer solution was spin-coated on a silicon wafer baked on a hot plate at 100° C. for 60 seconds, then n and k values were measured with VB-250 VASE Ellipsometer manufactured by J.A. Woollam Co. Inc. The measured optical properties of the film for about 193 nm radiation exhibited an n value of 1.406 and a k value of 0.0986.

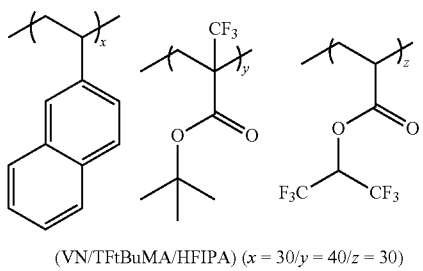

(VN/TFtBuMA/HFIPA) ($x = 30/y = 40/z = 30$)

EXAMPLE 5

Synthesis of polymer of 2-vinylnaphthalene, t-butyl acrylate and 1,1,1,3,3,3-hexafluoroisopropyl acrylate (VN/tBuA/HFIPA (30/40/30))

The synthetic procedure was the same as Example 1, except the amounts of monomers, initiator and solvent were: VN (1.39 g, 0.009 mole), t-butyl acrylate monomer (tBuA) (1.54 g, 0.012 moles), HFIPA (2.0 g, 0.009 moles), AIBN (0.295 g, 6% of total moles of monomers), and ~18 g of THF. The molecular weight (Mw) was determined by GPC to be 8.3K. The measured optical properties of the film for about 193 nm radiation exhibited an n value of 1.418 and a k value of 0873.

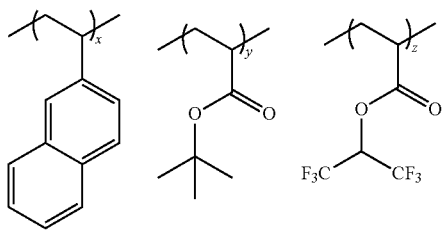

VN/tBuA/HFIPA ($x = 30/y = 40/z = 30$)

EXAMPLE 6

Secondary Ion Mass Spectrometry (SIMS) Study of a New Photoresist Formulated with the Addition of the Polymer of 2-vinylnaphthalene, 2-(trifluoromethyl)acrylic acid and 1,1,1,3,3,3-hexafluoroisopropyl acrylate (VN/TFMAA/HFIPA(30/30/40)) to a Commercial Photoresist Polymer VN/TFMAA/HFIPA (30/30/40) synthesized from Example 1 was mixed with a commercially available implant resist EPIC 2520 (from Rhom and Haas Inc.). The newly formulated TARC in-situ resist (EPIC-VN/TFMAA/HFIPA (30/30/40) contains 9 wt % of polymer VN/TFMAA/HFIPA (30/30/40) and 91 wt % of EPIC 2520 in the total solid content of the formulated resist solution. Three samples including the polymer, EPIC 2520 and EPIC-VN/TFMAA/HFIPA (30/30/40) were spin-coated on one inch silicon wafers and then analyzed with static SIMS. Static SIMS analysis with a nominal probe depth of approx 2-4 nm indicated significant top layer formation by the polymer VN/TFMAA/HFIPA (30/30/40) component of the mixture EPIC-VN/TFMAA/HFIPA (30/30/40). The extent of segregation could be inferred from the relative intensities of various mass fragments, which were characteristic to the individual components of the mixture. While an exact mole fraction determination of the components of the top layer was not attempted it is clear that there is a strong enrichment of greater than 90% of the polymer VN/TFMAA/HFIPA (30/30/40) component in the resist composition near the surface.

EXAMPLE 7

Lithographic Evaluation of a New Resist Formulated with the Addition of the Polymer of VN/TFMAA/HFIPA (30/40/30) to a Commercial Resist Polymer VN/TFMAA/HFIPA (30/40/30) synthesized from Example 2 was mixed with a commercially available implant resist EPIC 2520 (from Rhom and Haas Inc.). The newly formulated mixture (EPIC-VN/TFMAA/HFIPA (30/40/30)) contains 10 wt % of polymer VN/TFMAA/HFIPA (30/40/30) and 90 wt % of EPIC 2520 in the total solid content of the formulated resist solution. The EPIC-VN/TFMAA/HFIPA (30/40/30) formulation was spin-coated on a 12" silicon wafer, which was primed with HMDS prior to the coating (45 s, 120 C). The EPIC-VN/TFMAA/HFIPA (30/40/30) layer was post-apply baked at 115° C. for 60 seconds and exposed to 193 nm wavelength light on an ASML stepper (0.85 NA, 0.85 outer σ 0.6, inner σ annular illumination). The wafer was then post-exposure baked at 120° C. for 60 seconds. The wafer was developed using a single puddle develop process for 30 seconds with 0.263 N TMAH developer (Moses Lake's AD-10). Good resolution of 125 nm half pitch has been observed with a significant higher dose (56.5 mj) than that of EPIC 2520 (~20 mj). The higher dose observed with the EPIC-VN/TFMAA/HFIPA photoresist formulation as opposed to the EPIC only photoresist formulation is due to the addition of the VN/TFMAA/HFIP which will absorb light energy. The sensitivity of the EPIC-VN/TFMAA/HFIPA photoresist formulation can be increased, for example, by increasing the amount of PAG in the photoresist formulation.

Thus the embodiments of the present invention provide methods of forming antireflective coatings that require less equipment and time than conventional processes.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention.

What is claimed is:
1. A composition of matter, comprising:
a polymer having an ethylenic backbone
wherein said polymer consists essentially of the following monomers:

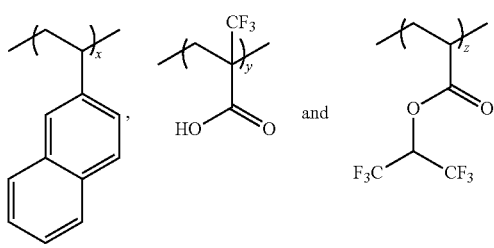

wherein x is between about 5 mole % and about 80 mole %, y is between about 5 mole % and about 80 mole %, z is between about 10 mole % and about 80 mole % and x+y+z=about 100 mole %; or wherein said polymer consists essentially of the following monomers:

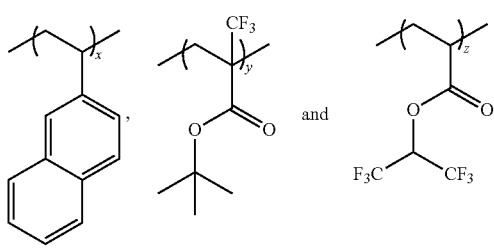

wherein x is between about 5 mole % and about 80 mole %, y is between about 5 mole % and about 80mole %, z is between about 10 mole % and about 80 mole % and x+y+z=about 100 mole %; or wherein said polymer consists essentially of the following monomers:

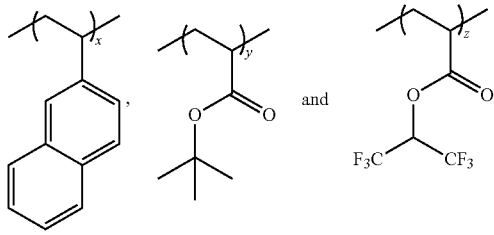

wherein x is between about 5 mole % and about 80 mole %, y is between about 5 mole % and about 80 mole %, z is between about 10 mole % and about 80 mole % and x+y+z=about 100 mole %.

2. The composition of matter of claim 1, further including: a casting solvent.

3. The composition of matter of claim 1, wherein said polymer has a refractive index of less than about 1.53 with respect to a radiation wavelength of about 193 nm.

4. A photoresist formulation, comprising:
a photoresist polymer;
at least one photoacid generator;
a casting solvent; and
an additive polymer having an ethylenic backbone and comprising a first monomer having an aromatic moiety, a second monomer having a base soluble moiety or an acid labile protected base soluble moiety, and a third monomer having a fluoroalkyl moiety; and wherein said second monomer also has a fluoroalkyl moiety wherein said additive polymer has the property such that when the formulation is coated on a substrate the additive polymer will migrate to the surface away from the substrate.

5. The photoresist formulation of claim 4, wherein said additive polymer has a refractive index of less than about 1.53 with respect to a radiation wavelength of about 193 nm.

6. The photoresist formulation of claim 4, wherein said aromatic moiety is selected from the group consisting of substituted or un-substituted aromatic moieties, substituted fused aromatic moieties, substituted heterocyclic aromatic moieties, un-substituted fused aromatic moieties and un-substituted heterocyclic aromatic moieties.

7. The photoresist formulation of claim 4, wherein said aromatic moiety is selected from the group consisting of naphthalene, acenaphthene and hexahydropyrene.

8. The photoresist formulation of claim 4, wherein said first monomer is:

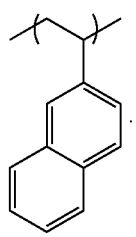

9. The photoresist formulation of claim 4, wherein said second monomer is selected from the group consisting of:

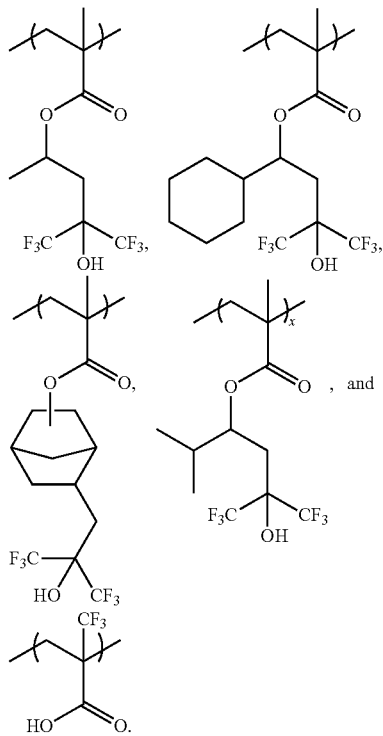

10. The photoresist formulation of claim 4, wherein said third monomer is selected from the group consisting of:

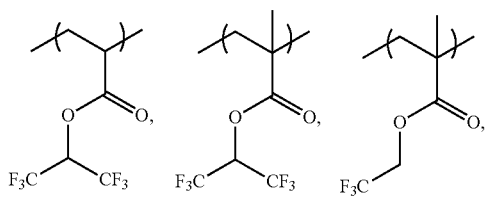

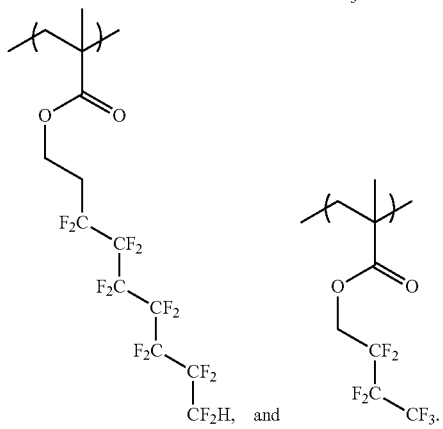

11. The photoresist formulation of claim 4, wherein said additive polymer consists essentially of the following monomers:

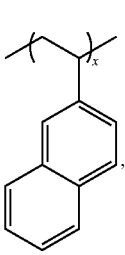
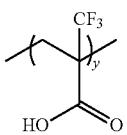

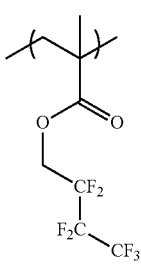

wherein x is between about 5 mole % and about 80 mole %, y is between about 5 mole % and about 80 mole %, z is between about 10 mole % and about 80 mole % and x+y+z=about 100 mole %.

12. The photoresist formulation of claim 4, wherein said additive polymer consists essentially of the following monomers:

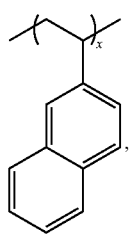
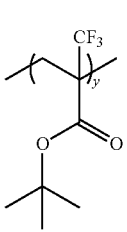 and

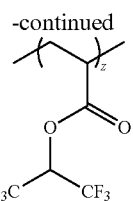

wherein x is between about 5 mole % and about 80 mole %, y is between about 5 mole % and about 80 mole %, z is between about 10 mole % and about 80 mole % and x+y+z=about 100 mole %.

13. The photoresist formulation of claim 4, wherein said additive polymer consists essentially of the following monomers:

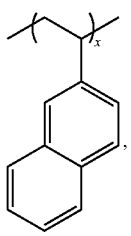
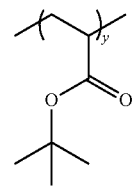 and

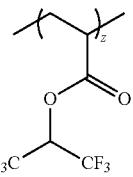

wherein x is between about 5 mole % and about 80 mole %, y is between about 5 mole % and about 80 mole %, z is between about 10 mole % and about 80 mole % and x+y+z=about 100 mole %.

14. A photoresist formulation, comprising:
a photoresist polymer;
at least one photoacid generator;
a casting solvent; and
an additive polymer having an ethylenic backbone; and
wherein said additive polymer consists essentially of the following monomers:

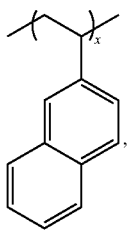
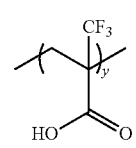 and

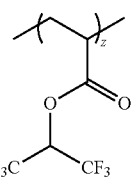

wherein x is between about 5 mole % and about 80 mole %, y is between about 5 mole % and about 80 mole %, z is between about 10 mole % and about 80 mole % and x+y+z=about 100 mole %; or wherein said additive polymer consists essentially of the following monomers:

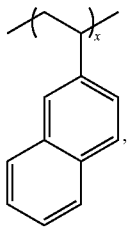 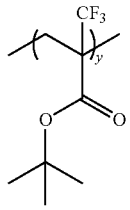 and

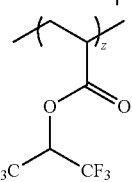

wherein x is between about 5 mole % and about 80 mole %, y is between about 5 mole % and about 80 mole %, z is between about 10 mole % and about 80 mole % and x+y+z=about 100 mole %; or wherein said additive polymer consists essentially of the following monomers:

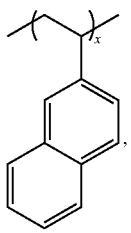 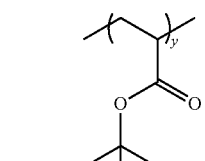 and

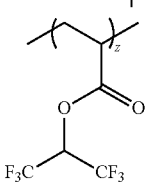

wherein x is between about 5 mole % and about 80 mole %, y is between about 5 mole % and about 80 mole %, z is between about 10 mole % and about 80 mole % and x+y+z=about 100 mole %.

15. The photoresist formulation claim 14, wherein said additive polymer has a refractive index of less than about 1.53 with respect to a radiation wavelength of about 193 nm.

16. The photoresist formulation of claim 14, wherein said additive polymer comprises between about 3% and about 30% by weight of said photoresist formulation.

\* \* \* \* \*